Jan. 12, 1965 C. K. FRIEND ETAL 3,165,698

AUTOMATIC FREQUENCY STABILIZATION UTILIZING OSCILLATION SEARCH SWEEP

Filed Aug. 2, 1962 2 Sheets-Sheet 1

INVENTORS:
Clifford K. Friend
Adrian D. Taylor
John Edward Stankey
Richard H. Swartley By Smyth, Roston & Pavitt Attorneys

AUTOMATIC FREQUENCY STABILIZATION UTILIZING OSCILLATION SEARCH SWEEP

Filed Aug. 2, 1962

2 Sheets-Sheet 2

INVENTORS:
Clifford K. Friend
Adrian D. Taylor
John Edward Stankey
Richard H. Swartley
By Smyth, Roston & Pavitt
Attorneys

United States Patent Office 3,165,698
Patented Jan. 12, 1965

3,165,698

AUTOMATIC FREQUENCY STABILIZATION UTILIZING OSCILLATION SEARCH SWEEP

Clifford K. Friend, Northridge, Adrian D. Taylor, West Covina, John Edward Stankey, Altadena, and Richard H. Swartley, Monrovia, Calif., assignors to Microdot Inc., South Pasadena, Calif., a corporation of California Filed Aug. 2, 1962, Ser. No. 214,347
20 Claims. (Cl. 325—148)

The invention disclosed below makes it possible for the first time to acquire, stabilize, and, if necessary, re-acquire automatically, the correct center frequency of the carrier signal in a frequency-modulated (FM) transmitter. Utilization of this invention in an FM transmitter makes it possible to generate and transmit an FM carrier signal characterized by exceptional fidelity and center-frequency stability. Moreover, the carrier signal may have a frequency as high as several thousand megacycles, and may be modulated directly through a modulation range extending from about zero at least to several hundred kilocycles.

The unusual FM signal fidelity achievable through use of this invention results largely from the fact that it makes possible the elimination of sources of signal distortion inherent in the frequency multipliers required in conventional FM systems. It is customary, for example, to generate and frequency modulate a relatively low frequency signal, and then use a chain of frequency multipliers to increase the FM signal to the carrier frequency of the transmitter.

The center-frequency acquisition and stabilization capability of this invention enables a carrier signal of several thousand megacycles to be frequency-modulated directly, and the resulting FM carrier signal to be coupled directly to the power amplifiers of the transmitter. Accordingly, this arrangement obviates signal distortions occurring in conventional transmitters from the nonlinear circuitry of the frequency-multiplier chain required between the frequency modulator and power amplifier stages.

In general, a center-frequency acquisition and stabilization unit in accordance with this invention operates to stabilize the center frequency of the FM carrier signal by mixing of a locally-generated signal of constant frequency with a portion of the FM carrier signal to produce an intermediate FM signal. The intermediate FM signal then is demodulated in a novel, balanced, transistorized frequency discriminator characterized by an output curve having a comparatively long linear segment, a direct-coupled input circuit, and the minimization of inductive elements to achieve light weight and compactness. The output signal of the discriminator is made up of a modulation component superimposed on a unidirectional component. The lower-frequency portion of the modulation component is cancelled by adding to it, in phase opposition, a corresponding portion of the original modulating signal. An integrating amplifier effectively eliminates any remaining portion of the modulation component, and produces a center-frequency, stabilization control signal. This signal is of unidirectional polarity, and represents the direction and magnitude of the rate of change, if any, of the actual center frequency of the FM carrier from the correct center frequency. The stabilization control signal then may be applied to the modulator of the FM oscillator to counteract center-frequency deviations within the stabilizing frequency range of the control signal, a range established by the frequency-response characteristic of the discriminator.

Whenever, for any reason, the actual center frequency is found to be beyond the stabilizing frequency-range of the control signal, it is acquired and returned to the control of the latter through use of an acquisition pulse provided by a novel acquisition-pulse generator. The acquisition pulse will have the effect of causing the frequency modulator to drive the center frequency of the FM oscillator rapidly to an upper limit at least within the stabilizing frequency-range of the control signal, and then to sweep downward in frequency more slowly until the stabilization control signal has assumed control of the center frequency of the FM carrier.

The acquisition pulse is generated by a novel, transistorized acquisition-pulse generator which is triggered automatically in response to the change in a unidirectional potential, developed in a conventional manner, whenever the correct center frequency deviates beyond the limits of the operating-frequency range of the discriminator. As described below in detail, this novel generator includes a monostable and a bistable electronic switch. Each of the switches is made up of two transistors coupled in complementary symmetry. Two networks of differing time constant are coupled respectively to the output terminals of the switches to develop a signal of sawtooth shape which, upon application to the integrating amplifier, will result in a sawtooth-shaped acquisition pulse having a leading edge of steep slope and a lagging edge of more gentle slope. The acquisition-pulse generator also includes means to prevent the monostable switch from resetting to its normally-open condition as long as the bistable switch is closed. This is an important feature which insures that the stabilization control signal will not assume control while the center frequency is passing through the lower sideband of intermediate FM output of the mixer or during the upward-sweep portion of acquisition.

In conventional FM transmitters for audio-frequency signals, it is feasible to operate the FM oscillator at a center frequency of about 5 or 6 megacycles, and then use successive stages of frequency multiplication interposed between the FM oscillator and the power amplifier to develop an FM carrier signal having a center frequency on the order of 100 megacycles. In these frequency ranges, the drift in center frequency of the output signal from the FM oscillator resulting from changes in ambient temperature and variations in the parameters of operating components is inherently small, and conventional automatic frequency control circuitry may be utilized to effect center-frequency stabilization.

For example, a well-known automatic-frequency control unit utilizes a crystal-controlled local oscillator for producing a signal of constant frequency. This signal is mixed with a portion of the FM signal output of the FM oscillator to produce a relatively low frequency signal on the order of a few hundred kilocycles, and containing a modulation component so small as to be inconsequential. The low-frequency output signal from the mixer then passes to a frequency discriminator where it is translated into a control signal representing the direction and magnitude of the significant drifts in center frequency. This control signal regulates the modulator stage of the FM oscillator to stabilize the FM signal at the correct center frequency.

Where an FM transmitter is required to transmit information represented by modulating signals varying in frequency from about zero to hundreds of kilocycles the conventional FM system outlined in the last paragraph is unsatisfactory. This is true because of the difficulty and expense of providing circuitry for processing signals which have modulation components constituting a large percentage of the center frequency of the FM signal.

In order to use modulation signals of high frequency, and still have an FM signal with a relatively low percentage modulation, it is necessary that the FM oscillator frequency be on the order of hundreds or thousands of megacycles.

Moreover, in systems where avoidance of spurious signals and high-fidelity reproduction of the modulating signals are important, it is desirable to dispense with frequency multipliers, and modulate the carrier signal directly. This will eliminate the signal distortions normally occurring in the multiplier circuitry.

Although it is desirable to modulate the carrier frequency directly, the prior art has been unable to resolve satisfactorily the problem of center frequency control of the FM carrier without the use of highly-complicated, costly, unreliable, bulky, and heavy circuitry. One of the principal sources of difficulty has been the fact that FM oscillators capable of operating at hundreds and thousands of megacycles are highly unstable. This means that the FM oscillator is subject to very large drifts in center frequency, and, at the time the transmitter is energized, may begin operating at a center frequency removed by several megacycles from the correct center frequency. As a result, the stabilizing circuitry must be effective over an extraordinarily broad band of frequencies, far exceeding the upper and lower frequency limits of the response-frequency characteristic of known automatic-frequency control systems.

The novel center-frequency acquisition and stabilization unit of this invention is operative through a range of frequencies exceeding the upper and lower limits of the normal center-frequency variations in the FM carrier signal. As already explained, this extraordinarily broad operating frequency range is effected through the expedient of an automatic center-frequency acquisition function for large disparities between the actual and correct center frequencies, and an automatic stabilization function for small differences. The acquisition function is of very short duration, continuing long enough to sweep the center frequency into the operating-frequency range of the stabilization function. This latter function then assumes control of the FM oscillator to maintain the correct center frequency of the carrier signal.

When a signal is not in the pull range of the discriminator and, therefore, outside the pass band of the signal detector the frequency stabilizing units cause the voltage on a reactance modulator to sweep, the reactance modulator being included in the automatic center frequency acquisition function. This change of voltage causes the oscillator to sweep through its frequency range. When the difference frequency between the variable oscillator and the crystal oscillator falls in the pass band of the signal detector and the pull range of the discriminator the frequency stabilizing unit providing the automatic stabilization function controls the frequency and the sweep is stopped.

In previous systems, it has been the custom to produce this result by applying a ramp waveform to the output of the system in such a way that it overcomes the normal operation of the system and forces the reactance modulator voltage to change. This ramp waveform would then be removed when the difference frequency came into the range where control was possible. This method has one serious limitation. The output of the discriminator must be integrated in order to remove the I.F. frequency components and to control the frequency response of the servo loop. Because of this, it takes a finite amount of time for the discriminator and integrator to stabilize the oscillator after a signal in the proper frequency band is present. As a result of this, it is necessary to sweep the output at a very slow rate in order that the sweep will not pull the signal out of the pass band before the integrator has time to charge up to its equilibrium voltage. As a result, such systems are very sluggish in acquiring lock after once losing control.

Rather than forcing the output to sweep as in the systems of the prior art, an additive signal is introduced into the integrator itself in the system constituting this invention, thereby causing its voltage to change and thus the output signal to sweep. In this case, when the difference signal sweeps to the correct frequency for stabilization, the integrator is already at the precise voltage for stabilization and equilibrium since it was the change introduced in the integrator which determined the output voltage. The net result is that the sweep speed is only limited by the time delay of the D.C. and I.F. amplifier and the triggering circuits.

In a preferred embodiment of this invention, a sample of the frequency-modulated signal, derived from the power amplifier of the transmitter, is mixed with the constant-frequency output signal of a crystal-controlled local oscillator to produce an intermediate FM signal having a comparatively narrow bandwidth of about 2.0 megacycles. After amplification and saturation limiting in an overdriven transistor amplifier, the resulting square-wave, intermediate FM signal is coupled directly to a unique, transistorized, balanced discriminator where the intermediate FM signal is translated into a replica of the modulation signal superimposed on a unidirectional voltage having a polarity and magnitude representing, respectively, the direction and extent of drift in the center frequency of the FM carrier. To insure rapid and effective stabilization of the center frequency, and virtual immunity from the effects of the modulation-signal component present in the output of the balanced discriminator, the low frequency portion of the latter is cancelled by adding to it, in inverse phase relation, a portion of the modulation signal of proper amplitude.

The remaining discriminator output signal then passes to an integrating amplifier where it is translated into a control signal representing the rate of change of the center frequency of the frequency-modulated signal. The integrating amplifier also eliminates or minimizes the effect of the higher-frequency portion of modulation signal component remaining in the discriminator output signal. The center-frequency, stabilization control signal produced at the output of the integrating amplifier may be utilized in any conventional manner to eliminate deviations of the center frequency of the FM carrier which are not attributable solely to the modulation input signal.

The preferred embodiment of this invention also includes an automatic center-frequency acquisition circuit which becomes operative automatically whenever, for any reason, the center frequency is outside the operating frequency band of the balanced discriminator. To provide this important function, the preferred embodiment utilizes a novel acquisition-signal generator having an output terminal coupled to the input of the integrating amplifier. Deviations in center frequency beyond the operating-frequency range of the balanced discriminator are sensed by a threshold detector coupled to a stage of the intermediate FM amplifier via a low-pass filter having an upper frequency limit no greater than the upper limit of the operating frequency range of the balanced discriminator. Thus a deviation of the center frequency of the intermediate FM signal outside the operating frequency band of the discriminator, results in a change in the output voltage of the threshold detector; and this change in voltage actuates the acquisition-pulse generator.

The acquisition-pulse generator produces a sawtooth output pulse having a steep leading edge and a lagging edge of more gentle slope. After passing through the integrating amplifier, the sawtooth pulse is utilized to sweep the center frequency of the FM carrier signal downward through a frequency range extending from a maximum limit conveniently near the upper limit of the operating-frequency band of the balanced discriminator to a lower limit at least equal to the correct center frequency of the intermediate FM signal. When the center frequency enters the operating frequency band of the balanced discriminator, the threshold detector again changes its output voltage and de-actuates the acquisition-pulse generator. From this time, the correct center frequency is maintained by the balanced discriminator and associated circuitry summarized above.

Inasmuch as actual embodiments of the novel FM center-frequency acquisition and stabilization circuit of this invention may be fully transistorized, and require the use of only two small inductive elements, compactness, light weight, and operating reliability are among its important and characteristic features. Furthermore, the ingenious combination of circuits capable of the dual functions of center-frequency acquisition, and center-frequency stabilization makes it possible to achieve distortionless control of the center frequency of inherently unstable FM oscillators having normal output frequency variations through a range of several megacycles.

The foregoing paragraphs are intended to summarize and explain the significance of this invention in relation to the problems which it resolves, and should not be construed to narrow the scope of protection provided by the claims. For a more complete understanding of the structure, operation and novel features of this invention, consider the following description with reference to the drawings, wherein:

GENERAL

Figure 1:
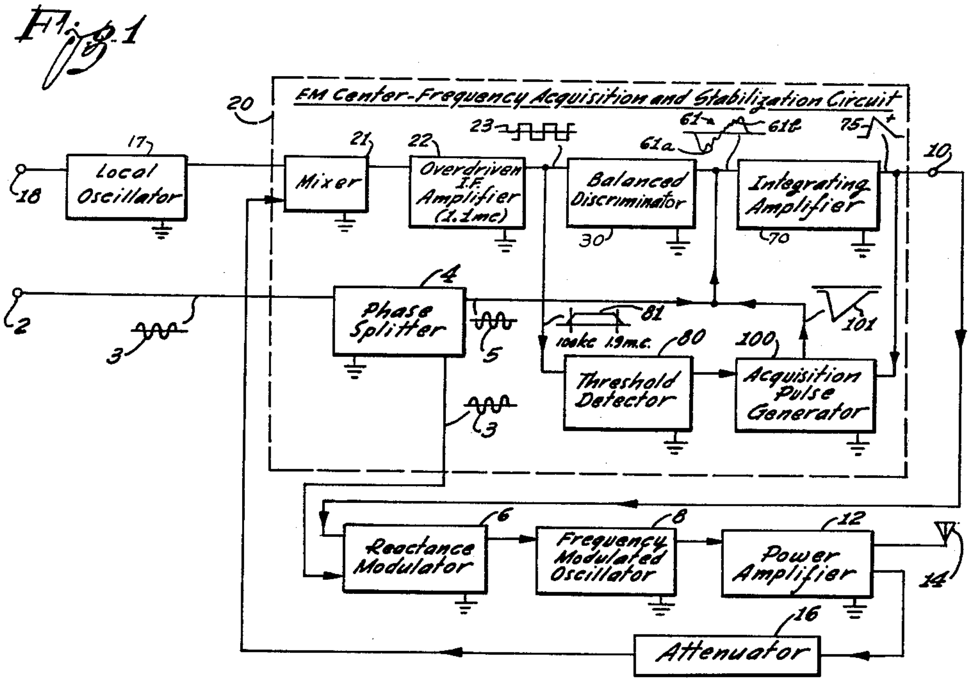
FIG. 1 is a block diagram representing the principal components of an FM transmitter incorporating the novel center-frequency acquisition and stabilization circuit of this invention.

As represented in FIG. 1, an improved FM transmitter incorporating the novel center-frequency acquisition and stabilization circuit of this invention may include a modulation-signal input terminal 2 coupled via a phase splitter 4 to a reactance modulator 6, an FM oscillator 8 for generating an FM carrier signal having bilateral frequency deviations of an amplitude and frequency determined by the modulation signal 3, and a power amplifier 12 for increasing the amplitude of the FM carrier signal to a level suitable for transmission from the antenna 14. The transmitter of FIG. 1 also includes the novel center-frequency acquisition and stabilization circuit 20, hereinafter referred to as the *AFC circuit*, which utilizes as inputs a sample of the FM carrier-signal output of power amplifier 12 reduced in amplitude by the attenuator 16, a signal of constant reference frequency generated by a crystal-controlled local oscillator 17, energized through terminal 18, and a phase-inverted sample of the modulation signal derived from the phase splitter 4 to produce a center-frequency stabilization control signal and a center-frequency acquisition pulse for application to the reactance modulator 6 of the transmitter.

In general, the novel AFC circuit 20 is comprised of a mixer 21 for combining a sample of the FM signal with the reference signal of the local oscillator 17 to produce an intermediate FM signal. An overdriven ampilfier 22 is provided for translating the intermediate FM signal into a square-wave signal 23 of the same frequency but of greater amplitude. The frequency deviations of the square-wave signal 23 of the overdriven amplifier 22 are translated by a unique balanced discriminator 30 into an output signal 61 made up of a modulation component **61*a*, superimposed on a unidirectional component, represented by the curve 61*b*, and having a polarity and magnitude determined by the difference between the actual center frequency of the intermediate FM signal and the correct center frequency. The phase splitter 4 provides a voltage 5 of modulation frequency and inverse phase for canceling at least the low frequency portion of the modulation component 61 at the output of the balanced discriminator 30. An integrating amplifier 70 increases the magnitude of the unidirectional component 61*b* of the output signal of the balanced discriminator 30 and effectively bypasses the higher-frequency portion of the modulation component 61*a* of the output signal 61 to produce a center-frequency stabilizing control signal of unidirectional polarity for use by the reactance modulator 6** in maintaining the FM carrier signal at the correct center frequency.

The transmitter of FIG. 1 further includes a novel acquisition-pulse generator 100 coupled to the input terminal of the integrating amplifier 70, and a threshold detector 80 operable in response to frequencies outside the intermediate FM band through which the balanced discriminator 30 is responsive, to trigger a cycle of operation of the acquisition-pulse generator 100 to produce the acquisition pulse 75. After amplification and inversion in the integrating amplifier 70, the output pulse 101 of the acquisition-pulse generator 100 is applied to the reactance modulator 6 of the transmitter to sweep the center frequnecy of the FM carrier signal to a maximum somewhat higher than that required to produce an intermediate FM signal having a frequency higher than the correct intermediate center frequency, and then, at a slower rate, to sweep the intermediate center frequency downward toward the correct center frequency. When the intermediate center frequency is within the upper sideband of frequencies curve 81, to which the balanced discriminator 30 can respond, the threshold detector 80 applies a disabling potential to the acquisition-pulse generator 100, and the balanced discriminator 30 proceeds to stabilize the FM carrier signal developed by the frequency-modulated oscillator 8 at the correct center frequency.

Figure 2:
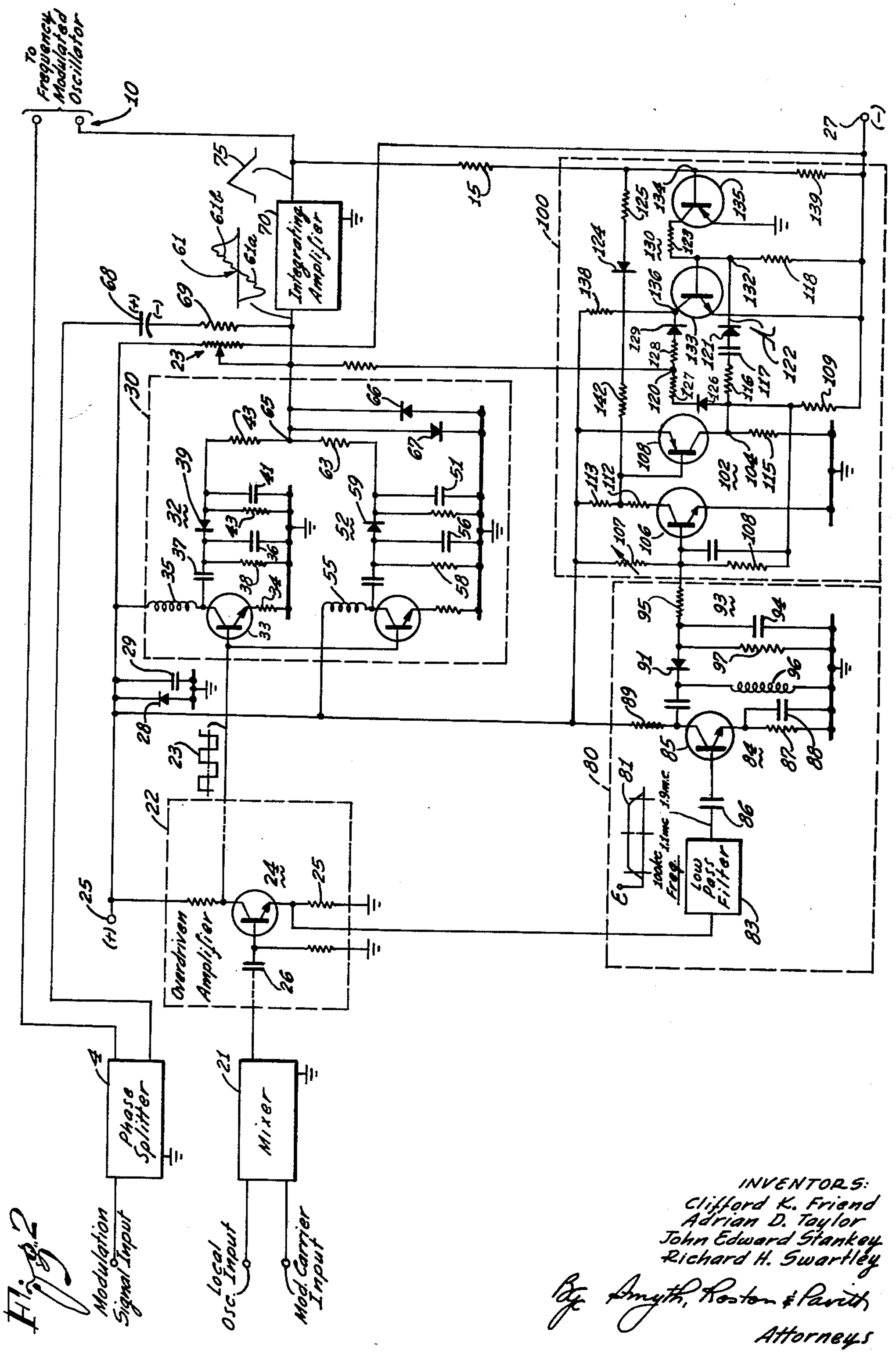
FIG. 2 is a schematic-block diagram representing the circuit configuration of the preferred embodiment of this invention.

The preferred embodiment of this invention is represented in the schematic-block diagram of FIG. 2. To facilitate cross reference between the figures, the same reference numerals are used to identify units and components common to each. Furthermore, where the phrase, "source of constant reference potential" is used, its meaning should not be understood as limited to an earth ground; instead, it may be construed as an input terminal for a power supply, a common terminal, or any other source of constant reference potential.

The AFC circuit of FIG. 2 operates from sources (not shown) of positive and negative potential coupled respectively to terminals 25 and 27. A zener diode 28 is coupled between the positive input terminal 25 and a ground source of reference potential to stabilize the supply voltage of the overdriven amplifier 22, the balanced discriminator 30, the phase splitter 4, threshold detector 80, and a portion of the acquisition-signal generator 100. A suitable capacitor 29 is coupled across the zener diode 28 to bypass unwanted A.-C. components.

The mixer 21, coupled to the local oscillator 17 (FIG. 1) and the power amplifier 12 (FIG. 1) may be any one of a number of conventional and well known circuits. For example, a conventional mixer circuit found to be especially suitable for use in combining an FM carrier signal of several thousand megacycles with a reference-frequency signal on the order of one or two hundred megacycles to produce upper and lower frequency sidebands having respective intermediate center frequencies slightly higher than a megacycle may utilize solid-state diodes as voltage-controlled capacitors in accordance with the principles set forth in an article by D. Leenov and A. Uhler, entitled "Generation of Harmonics at Microwave Frequencies with P–N Junction Diodes," published in the Proceedings of the Institute of Radio Engineers, October 1959, page 1724. In general, a mixer of this type utilizes a semiconductor diode as a variable capacitor to prevent nulls in the difference signal output. The reference and FM carrier signals applied to the mixer 21 result in upper and lower frequency sidebands of the type represented in FIG. 3, curve C, and extending from about 0 to 2.0 megacycles in width. The correct intermediate center frequency for the sidebands is 1.1 megacycles.

The overdriven amplifier 22, coupled to the output terminal of mixer 21, comprises a plurality of resistance-capacitance coupled transistor amplifiers. These amplifiers may be like the amplifier 24, except that each of them will utilize a bypass capacitor coupled across emitter resistor 25*a* to eliminate degenerative effects. One or more stages of the overdriven amplifier 24 utilize saturation limiting to clip the peaks from the generally-sinusoidal output signal of the mixer 21. The limiting action of the overdriven amplifier 22 has the effect of removing variations in amplitude from the intermediate FM signal, and results in a square-wave output signal 23 of constant amplitude. For reasons which will be explained below, the respective capacitances of the coupling capacitors 26 between successive stages of overdriven amplifier 22 are chosen to attenuate frequencies below 100 kilocycles. Inasmuch as the transistorized amplifying stages of amplifier 22 are conventional in other respects, a detailed description of their circuitry and operation is omitted.

*Description of Balanced Discriminator and Phase Splitter*

The balanced discriminator 30 translates the intermediate, square-wave FM signal 23 of the overdriven amplifier 22 into a replica 61*a* of the modulation-input signal 3 varying with respect to a unidirectional voltage component 61*b*. The unidirectional component 61*b* has a polarity representing the direction, and a magnitude representing the extent, of any existing drift of the actual from the correct intermediate center frequency. The unique FM discriminator 30 is characterized by light weight and a minimum number of small components which can be packaged compactly in a very small space, and a frequency-output voltage characteristic 61*b* having a long linear segment to help insure an output signal virtually free from spurious components. Minimization of weight and compactness are attributable principally to the fact that the balanced discriminator 30 utilizes transistor circuitry, and features direct coupling to the output terminal of the overdriven amplifier 22, an innovation which makes it possible to eliminate the bulky and heavy input transformer required by conventional discriminators.

In general, the improved balanced discriminator 30 comprises an upper translating channel 32 tuned, for example, for a peak response to intermediate FM signals of 0.6 megacycle, and a lower signal-translating channel 52 tuned, for example for peak response at a frequency of 1.6 megacycles. Thus, the upper channel 32 and lower channel 52 are tuned for respective peak responses to signals displaced 500 kilocycles below and 500 kilocycles above the assumed correct intermediate center frequency of 1.1 megacycles.

Inasmuch as the upper channel 32 and the lower channel 52 of the balanced discriminator 30 have similar circuit configurations, only the upper channel 32 will be described in detail. The output signal 23 of the overdriven amplifier 22 passes directly to the base of an N-P-N transistor 33 coupled in the common-emitter configuration to function as a degenerative amplifier having a gain of about unity. The transistor 33 provides a constant output impedance for the overdriven amplifier 22. An emitter biasing resistor 34 has a degenerative effect on the input signal, limits gain to about one, and insures virtual immunity to wide fluctuations in ambient temperature. The collecor of transistor 33 is coupled to a series resonant L-C circuit made up of the inductor 35 coupled between the collector and the positive power-input terminal 25, and the capacitor 36 coupled in series with blocking capacitor 37 between the collector of the transistor 33 and the ground source of constant potential. The resistor 38, coupled in parallel with capacitor 36, is useful in establishing the Q of the tuned circuit. In this instance, the parameters of the tuned circuit are chosen to provide maximum response at 600 kilocycles. A semiconductor diode 39 is oriented to detect the negative half-cycles of the signal developed across the tuned circuit, and a resistance-capacitance filter network made up of capacitor 41 and resistor 43 coupled to the plate of the semiconductor diode 39 effectively bypasses intermediate-frequency signal components, but develops a unidirectional negative potential across a load resistor 43 having a component fluctuating at the frequency of the modulation signal 3 (FIG. 1).

The lower channel 52 of the balanced discriminator 30 has the same circuit configuration as the upper channel 32 and the components of the lower channel 52 fulfill the same operating requirements as their counterparts in the upper channel. However, the lower channel 52 differs in two significant respects from upper channel 32. First, the inductor 55, the capacitor 56, and the resistor 58, comprising the essential elements of the L-C tuned circuit of the lower channel 52, are chosen for peak response at 1.6 megacycles; and, second, the semiconductor diode detector 59 is oriented to pass only the positive half-cycles of the intermediate FM signal received from the overdriven amplifier 22.

The positive and negative modulation components of the intermediate FM signal detected in the upper channel 32 and lower channel 52 of the balanced discriminator 30, will be in the form of pulsations 61*a* with respect to a unidirectional component 61*b* having a magnitude and polarity determined by the intermediate center frequency about which the signal 23 from the overdriven amplifier 22 is varying. If the center frequency is correct, the unidirectional signal 61*b* passed by the upper and lower channels 32 and 52, respectively, will have equal unidirectional components of opposite polarity.

The resistors 43 and 63 coupled in series constitute a bridge between the upper channel 32 and the lower channel 52 of the balanced discriminator 30. The output terminal 65 of the balanced discriminator 30 is located at the midpoint of the bridge. When the unidirectional components of the output signals of the upper channel 32 and the lower channel 52 are equal, the intermediate FM signal 23 is at the correct center frequency, and the output signal of the discriminator 30 does not contain the unidirectional component 61*b*. Under these conditions, the reference potential, if any, present at the output terminal 65 effectively is zero. Accordingly, the integrating amplifier 70 does not receive an input signal, and the AFC system does not produce an error signal at output terminal 10.

A potentiometer 23, coupled between the power-input terminals 25 and 27 may be utilized to establish a steady-state voltage suitable for the discriminator output terminal 65. When an inequality in the magnitudes of the respective negative and positive unidirectional signals developed by the upper and lower channels 32 and 52, respectively, of the balanced discriminator 30, result in a unidirectional component 61*b* in the signal 61 at the output terminal 65, the magnitude of this unidirectional component 61*b* is limited by one or the other of the semiconductor diodes 66 and 67 oriented in opposite directions, and coupled in parallel between the output terminal 65 and the ground source of constant potential. This feature eliminates the possibility that output signals of excessive magnitude from the balanced discriminator 30 will damage the solid state components used in the conventional integrating amplifier 70.

Figure 3:
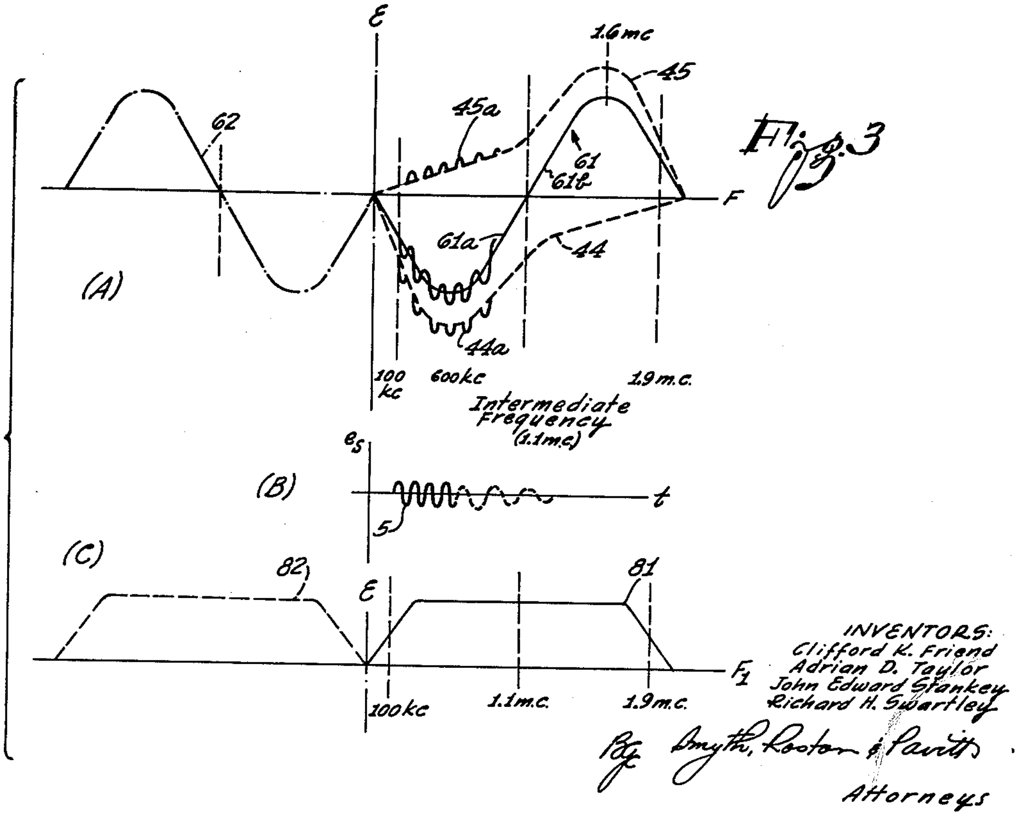
FIG. 3 is a graphic representation of typical signal states at the output terminal of the unique balanced-discriminator circuit.

The curves of FIG. 3, part (A) portray the operation of the balanced discriminator 30. The dotted curve 44 represents the variation in the magnitude of the positive sginal developed by the upper channel 32 for useful variations in signal frequency extending from a lower limit of about 100 kilocycles to an upper limit of about 1.9 megacycles. Inasmuch as the upper channel 32 is tuned by the L-C parallel-resonant circuit made up of inductor 35 and capacitor 36, the maximum negative output voltage of this channel will occur at 600 kilocycles. The frequency versus signal amplitude curve for the lower channel 52 is represented by the dotted curve 45, which has a maximum positive output voltage at 1.6 megacycles. Because the tuned circuits of the upper and lower channels 32 and 52 have the same Q, curves 44 and 45 have the same configuration.

When added algebraically at the output terminal 65 of the balanced discriminator 30, the output signals of the upper and lower channels 32 and 52 result in a composite signal, represented by the solid curve 61. Thus, when the intermediate FM signal 23 is at the correct center frequency of 1.1 megacycles, the respective output signals of the upper and lower channels 32 and 52 are equal and opposite, and the resulting composite signal 61 effectively is zero. On the other hand, if the intermediate center frequency is below 1.1 megacycles, the signal developed in the upper channel 32 becomes predominant, and a unidirectional signal of negative polarity will appear at the discriminator output terminal 65. Conversely, if the intermediate center frequency is above 1.1 megacycles the signal detected by the lower channel 52 will predominate, and a unidirectional potential of positive polarity will appear at the output terminal 65.

It should be noticed that the characteristic curves 44 and 45 representing the signal-amplitude versus frequency characteristics of the upper and lower channels 32 and 52, respectively, should have the same configurations, and be such that the resultant frequency versus signal-amplitude curve 61 will have a linear slope extending on each side of the correct intermediate frequency to upper and lower frequency limits corresponding to the maximum deviations of the FM carrier signal. For example, the unidirectional component *61b* of the signal-amplitude versus frequency curve 61 represented in FIG. 3, part (A), is linear for at least 400 kilocycles on each side of the intermediate center frequency of 1.1 megacycles. Hence, an AFC system embodying discriminator 30, may have a modulation frequency range extending from 0 to 400 kilocycles before nonlinear response of the discriminator would begin to produce spurious signals at the output terminal 65. This is important because spurious signals would not be cancelled by the out-of-phase modulation signal 5 (FIG. 1) added from the phase splitter 4 of the output signal 61 of balanced discriminator 30, and these signals upon amplification in the integrating amplifier 70 would result in the application of false error signals to the frequency-modulated oscillator 8 (FIG. 1).

As represented by the signal-amplitude versus frequency curves 44 and 45 for the upper channel 32 and lower channel 52, respectively, small portions *44a* and *45a* of their modulation components are not integrated or by-passed by the capacitors 41 and 51, and are combined at the discriminator output terminal 65 to form the modulation component *61a* superimposed on unidirectional component *61b* of the discriminator output signal 61.

The phase splitter 4 provides a modulation signal 5 of inverse phase for addition to the output signal 61 of the balanced discriminator 30 to cancel at least the lower-frequency portion of the modulation component *61b* of output signal 61. The phase splitter 4 is conventional, and a detailed description of its circuitry appears to be unnecessary. Its inverted output signal 5, represented in FIG. 3, part (B), is coupled via a capacitor 68 and an impedance-matching resistor 69 to the output terminal 65 of the balanced discriminator 30. The inverted output signal 5 is adjusted to have an amplitude effectively equal to the amplitude of at least the lower-frequency portion of the modulation component *61a* of the discriminator output signal 65. Hence, the addition of the inverted-signal 5 of the phase splitter 4 to the output signal 61 effectively cancels the lower-frequency portion of the modulation component *61a*, and leaves only the unidirectional component *61b*, if any, together with some of the higher-frequency portion of the modulation component *61a* as an input to the integrating amplifier 70. The integrating amplifier 70 effectively eliminates the high frequency components, and these will have no effect on the resulting stabilization control signal produced at the output terminal 10 of the AFC system.

*Threshold Detector and Acquisition-Pulse Generator*

The ingenious combination of threshold detector 80 and acquisition-pulse generator 100 enables the AFC system of this invention to be used in stabilizing the center frequency of an FM oscillator operating at frequencies of thousands of megacycles. Hence, the frequency-modulated carrier signal may be generated without a chain of frequency multipliers of the type required for conventional frequency-modulation transmitters. This is significant in transmitters which must operate with minimal distortion of the modulation-signal, for it is well known that conventional frequency multipliers have nonlinear characteristics which can be made linear, if at all, only through the use of complicated, expensive, bulky, heavy and unreliable circuitry. It is these nonlinearities, of course, which result in unwanted spurious signal components in the FM carrier.

In general, the function of the threshold detector 80 is to trigger a cycle of operation of the acquisition-pulse generator 100 whenever the actual center frequency of the intermediate FM signal produced by the mixer 21 has drifted, for any reason, beyond the 100 kc. to 1.9 mc. operating-frequency band of the balanced discriminator 30. The acquisition-pulse generator 100 applies a pulse of negative polarity to the input of the integrating amplifier 70 in order to produce an acquisition pulse 75 having a sawtooth with a steep leading edge and a more gently sloping lagging edge at the output terminal 10 of the AFC system. The effect of the acquisition pulse 75 is to sweep the center frequency of the frequency-modulated oscillator 8 (FIG. 1) rather abruptly to a maximum frequency somewhat in excess of the upper limit of the upper sideband 81 (FIG. 3, part (C)) of intermediate FM frequencies produced by the mixer 21; that is, to a maximum frequency which will result in an intermediate center frequency at least greater than the correct center frequency of 1.1 megacycles in the upper sideband 81.

Although the intermediate center frequency may be swept upwardly through a lower sideband 82 in the 100 kc. to 1.9 mc. operating frequency range of the balanced discriminator 30 during the rapidly ascending portion of the acquisition pulse 75, the acquisition-pulse signal generator 100 contains circuitry to prevent the balanced discriminator 30 from assuming control of the AFC system during this portion of the frequency excursion. This feature is important because the ascending portion, or leading edge, of the acqusition pulse 75 in sweeping the intermediate center frequency upwardly through the lower sideband 82 of intermediate FM signals produced by the mixer 21, otherwise would have the undesirable result of causing the balanced discriminator 30 to lock on at the 1.1 megacycle intermediate center frequency of the lower sideband 82. If this should occur, the discriminator output signal developed at terminal 65 would have a configuration like that of curve 62, FIG. 3, part (A), and the resulting stabilization control signal developed on output terminal 10 of the AFC system would be of reverse polarity. As a result the AFC system would stabilize the FM carrier of the FM oscillator 8 at an incorrect center frequency.

As represented in FIG. 2, the threshold detector generally comprises a low-pass filter 83, a single-stage transistor amplifier 84, a semiconductor diode 91 for developing a unidirectional potential of negative polarity, and a resistance-capacitance filter 93 for smoothing the voltage developed on the plate of diode 91.

The low-pass filter 83 may be comprised of any conventional circuitry of low impedance to signal frequencies less than a frequency somewhat above the correct intermediate center frequency of 1.1 megacycles, but of higher impedance to signal frequencies exceeding the 1.9 megacycle upper limit of the operating-frequency band of the balanced discriminator 30. For example the low-pass filter 83 may be comprised of an inductor and two capacitors connected in conventional Pi configuration. To limit the low frequency response of the threshold detector 80, the coupling capacitors 26 of the overdriven amplifier 22 are chosen to provide a high impedance to signal frequencies less than the 100 kilocycle lower limit of the operating-frequency band of the balanced discriminator 30. As a result, only intermediate FM signals having a frequency within the operating-frequency band of the balanced discriminator 30 will be applied to the threshold detector 80.

As long as the intermediate FM signal frequency is within the operating frequency band of the balanced discriminator 30, the output voltage of the threshold detector 80 renders the acquisition-pulse generator 100 inoperative. On the other hand, whenever the intermediate center frequency is outside the operating-frequency band of the balanced discriminator 30, the voltage output of the threshold detector 80 conditions the acquisition-pulse generator 100 to produce the acquisition pulse 75 in order to restore the intermediate center frequency to the operating-frequency range of the discriminator 30.

The amplifier 84 of threshold detector 80 is comprised of an N-P-N transistor 85 coupled in the common emitter configuration. The intermediate FM signal from the low-pass filter 83 reaches the base of transistor 85 via a blocking capacitor 86. A resistor 87 and a bypass capacitor 88, coupled in parallel, provide a suitable positive bias potential for the emitter of the transistor 85, and a resistor 89, coupled between the collector and the positive-power input terminal 25 provides a suitable impedance for developing the output signal of amplifier 84.

The semi-conductor diode 91 has its cathode coupled via a blocking capacitor 92 to the collector of the transistor 85. An inductor 96 is coupled between the cathode of diode 91 and the ground source of constant potential to prevent the accumulation of a positive electrical charge on the right hand plate of the blocking capacitor 92 as a result of the positive half-cycles of the output signal developed across collector resistor 89.

During negative half-cycles of the output signal from amplifier 84, a pulsating voltage of negative polarity is developed across a resistor 97 coupled between the plate of the semiconductor 91 and the ground source of constant potential. The negative voltage pulsations are smoothed by the resistance-capacitance filter 93 made up of capacitor 94, coupled between the plate of the semiconductor diode 91 and the ground source of constant potential, and a resistor 95.

Hence, as long as the intermediate FM signal output from the mixer 21 is within the operating-frequency range of the balanced discriminator 30, the threshold detector 80 develops unidirectional output signal of negative polarity having a magnitude sufficient to render the acquisition-pulse generator 100 inoperative. However, when the intermediate center frequency of the signal supplied to the threshold detector 80 is outside the 100 kc. to 1.9 mc. operating-frequency band of the balanced discriminator 30, its amplitude is attenuated either by the low-pass filter 83 or by the coupling capacitors 26 between stages of overdriven amplifier 22, and the magnitude of the negative output potential of the threshold detector 80 diminishes to the triggering threshold of acquisition-pulse generator 100.

The unique acquisition-pulse generator 100 comprises a first direct-coupled, complementary amplifier 102 which receives its input signal from the threshold detector 80, a second direct-coupled complementary amplifier 130 having a first input terminal 132 coupled to the output terminal 104 of the first amplifier 102, and a second input terminal 134 coupled via a voltage-dropping resistor 15 to the common output terminal 10 of the AFC system and the integrating amplifier 70, and a pulse output terminal 120 coupled to the input of the integrating amplifier 70. A resistor 142 is coupled between the output terminal 136 of the second amplifier 130 and the first amplifier 102 to prevent the latter from becoming inoperative during the time that a signal is present at the output terminal 136 of the second amplifier 130. In general, the first and second amplifiers 102 and 130 are characterized by high gain, and response times comparable to those achieved through the use of conventional Schmitt trigger circuits.

The first amplifier 102 operates effectively as a monostable electronic switch which remains in the "open" state as long as the unidirectional output voltage of the threshold detector 80 is sufficiently negative, and switches to the "closed" state whenever the output signal of the threshold detector 80 becomes less negative on account of an incorrect intermediate center frequency outside the operating-frequency band of the balanced discriminator 30.

The second amplifier 130 functions effectively as a bistable electronic switch, being normally nonconductive, but switched to the "closed" state in response to the output signal of the first amplifier 102 when the latter "closes," and being switched into the "open" state again in response to the positive peak voltage of the acquisition pulse 75 developed at the output terminal 10 of the AFC system.

To summarize, it should be apparent that the first amplifier 102 can turn on the second amplifier 130, and as long as the latter is on, the first amplifier cannot be turned off. Moreover, the second amplifier 130 is turned off only in response to the positive peak voltage of the acquisition pulse 75 developed at the output terminal 10 of the AFC system. This change of state of the second amplifier 130 has no effect on the change of state of the first amplifier 102; the latter can be turned off only by restoration of the negative output signal of the threshold detector 80 to its original negative magnitude.

The first complementary amplifier 102 of acquisition-pulse generator 100 is comprised of the N-P-N transistor 106 and the P-N-P transistor 108 intercoupled directly in complementary symmetry. The base of transistor 106 of the first amplifier 102 is biased to a positive potential by the variable resistor 107 coupled to the positive power-input terminal 25. This resistor forms one element of a voltage divider which also includes the resistors 108 and 109 coupled in series between the base of transistor 106 and the negative power-input terminal 27. A circuit point common to resistors 108 and 109 is coupled to the output terminal 104 of the first amplifier 102 to establish the negative cutoff potential required to maintain the second amplifier 130 in a non-conductive state. A capacitor 111, coupled across resistor 108 of this divider, immunizes the first amplifier from the effects of spurious transients.

The emitter of transistor 106 is coupled directly to a ground source of constant reference potential, and the collector is coupled via a voltage divider made up of resistor 112 and resistor 113 to the positive power-supply terminal 25. The output voltage of transistor 106, developed across the resistor 112, is coupled directly to the base of the P-N-P transistor 108. The emitter of transistor 108 is coupled directly to the positive power terminal 25, and its collector, coupled at output terminal 104 to the midpoint of a divider formed by the resistors 109 and 115 connected in series between the negative power-input terminal 27 and a ground source of constant potential, normally is maintained at a negative potential sufficient to prevent conduction in the second amplifier 130.

The positive output signal from the first amplifier 102, developed at output terminal 104, is coupled via the voltage dropping resistor 116 and a differentiator network, made up of the series combination of coupling capacitor 117, resistor 118, and semiconductor diode 121, to the first input terminal 132 of the second amplifier 130. The semiconductor diode 121 is oriented to pass a positive pulse 122 of short duration from output terminal 104 to input terminal 132 in response to the initiation of conduction in amplifier 102.

The second amplifier 130 is comprised generally of the N-P-N transistor 133 and the P-N-P transistor 135 intercoupled directly in a complementary-symmetrical arrangement. The base of the N-P-N transistor 133 is coupled via input terminal 132, in the manner already described, to the output terminal 104 of the first amplifier 102. A negative bias potential from the negative power input terminal 27 is applied to the base of transistor 133 via resistor 118. The emitter of the N-P-N transistor 133 is coupled directly to the negative power input-terminal 27, and its collector is coupled to the positive power-supply terminal 25 via the amplifier output terminal 136 and load resistor 138. The emitter of the P-N-P transistor 135 is coupled directly to a ground source of constant potential. The base of the P-N-P transistor 135 is biased suitably by the voltage developed at the midpoint of a voltage divider made up of the resistors 15 and 139 coupled in series between the negative power-input terminal 27 and the output terminal 10 of the AFC system. The collector of transistor 135 normally is biased to a suitable negative potential by resistors 118 and 123 coupled in series to the negative power-input terminal 27. A semiconductor diode 124 and a resistor 125 coupled in series between the output terminal 136 of the second amplifier 130, and the base of the P-N-P transistor 135 constitutes a unidirectional circuit for coupling the output signal of the former to the latter.

To provide a negative-going, sawtooth-shaped output signal 101 from the acquisition-pulse generator 100, a unidirectional voltage divider is coupled between the respective output terminals 104 and 136 of the first and second amplifiers 102 and 130. This divider is comprised of the semiconductor diode 126, resistor 127, resistor 128, and semiconductor diode 129, coupled in series in the order named from the output terminal 104 of the first amplifier 102 to the output terminal 136 of the second amplifier stage 130. The output terminal 120 of the acquisition-pulse generator 100 is at a point common to the resistors 127 and 128 of this divider, and the semiconductor diodes 126 and 129 are oriented to conduct electron current only from output terminal 136 to output terminal 104. Furthermore, the resistor 128 of the divider is chosen to have an impedance lower by several orders of magnitude than resistor 127. The low impedance of resistor 128 insures a comparatively short time constant for the leading edge of the negative-sawtooth output signal 101 developed at the output terminal 120. This insures a relatively-steep leading edge for the acquisition pulse 75 developed at the output terminal 10 of the AFC system. Conversely, the relatively high impedance of resistor 127 of the divider results in a comparatively long time constant, and results in the more gently sloping lagging edge of the acquisiton pulse 75.

The operation of the acquisition-pulse generator 100 is initiated whenever, for any reason, an incorrect intermediate center frequency outside the effective band-pass characteristic 81 of the filtered input to the threshold detector 80 results in diminution of the negative voltage normally applied to the base of the N-P-N transistor 106 of the first amplifier 102. As long as the intermediate center frequency is within bandpass characteristic 81, the FM oscillator 8 (FIG. 1) is maintained at the correct center frequency by the stabilization control signal developed at the output terminal 10 of the AFC system by the balanced discriminator 30 and the integrating amplifier 70. Furthermore, the threshold detector 80 produces a negative output signal of sufficient magnitude to maintain the acquisition-pulse generator 100 inoperative.

However, when the potential applied to the base of transistor 106 of the first amplifier 102 rises sufficiently to permit an effective forward bias to be applied across its emitter-base junction, current begins flowing through the emitter-collector circuit. As a result, the positive cutoff potential which formerly existed on the base of P-N-P transistor 108 is diminished, heavy current flow begins through its collector-emitter circuit, and the negative potential formerly present at the output terminal 104 changes abruptly to a positive potential.

The positive output signal of the first amplifier 102 is differentiated to form the positive pulse 122 which momentarily removes the negative cutoff bias which formerly existed on the base of transistor 133, and permits current to flow through its emitter-collector circuit. As a result, the positive potential which formerly existed at the output terminal 136 of transistor 133 abruptly becomes negative, and this change in voltage is coupled via the semiconductor 124 and resistor 125 to the base of the P-N-P transistor 135. This negative potential initiates current flow through the collector-emitter circuit of transistor 135, and, once this occurs, the base of transistor 133 is held at a potential sufficiently positive to maintain conduction in its emitter-collector circuit.

From the foregoing, it should be apparent that a diminution in the negative output signal from the threshold detector 80 sufficient to trigger the acquisition-pulse generator 100 has the effect of switching the first amplifier 102 and the second amplifier 130 almost instantaneously from a cutoff state into a state of conduction. This has the effect of producing a negative potential at the output terminal 136 of the second amplifier 130, and a positive potential at the output terminal 104 of the first amplifier 102. The latter potential however has only a nominal effect on the immediate change in potential which ensues at the output terminal 120 of the generator 100. For the negative potential at output terminal 136 is coupled via the comparatively low impedance of resistor 128 to output terminal 120; and, in combination with the feedback capacitor (not shown) of the conventional integrating amplifier 70, forms a resistance-capacitance circuit having a short time constant for generating the steeply-ascending leading edge of the acquisition pulse 75.

When the leading edge of the acquisition pulse 75 has reached a predetermined positive magnitude, the potential developed at the base of the P-N-P transistor 135 of the second amplifier 130 becomes sufficiently positive to cut off current flow in its collector-emitter circuit. This restores the negative cutoff potential to the base of the N-P-N transistor 133, and the consequent cessation of conduction in the collector-emitter circuit of the latter enables the voltage at output terminal 136 to become positive. The nearly-simultaneous events described above enables the negative voltage at output terminal 120 to diminish under the influence of the positive voltage remaining at the output terminal 104 of the first amplifier 102. This positive-going change occurs somewhat more slowly than the preceding negative-going change at terminal 120 on account of the much longer time constant resulting from the comparatively high impedance of resistor 127. Accordingly, the lagging edge of the sawtooth acquisition pulse 75 has a much more gentle slope than its leading edge.

As explained above, the acquisition pulse 75 rapidly sweeps the frequency of the FM oscillator (FIG. 1) to a maximum during the short time interval represented by the ascending leading edge of the pulse 75, and the frequency then is swept downward somewhat more slowly until the output of the mixer 21 results in an intermediate center frequency within the operating-frequency range of the blanaced discriminator 30. Once this occurs, the output signal of the threshold detector 80 is restored to its maximum negative potential, and the first amplifier 102 abruptly ceases to conduct.

It should be noticed that the resistor 142, comprising a feedback circuit between the output terminal 136 of the second amplifier 130 to the base of P-N-P transistor 108 of the first amplifier 102, maintains a negative potential on the latter, and insures its conduction throughout the time that the center frequency is being swept from minimum to maximum by the acquisition pulse 75. As explained previously, this is an important feature because the AFC system is prevented from "locking on" erroneously to the correct center frequency of 1.1 megacycles present in the lower sideband 82 of frequencies developed at the output of the mixer 21.

As shown by curve 62 in FIG. 3, Part (A), "locking on" of the balanced discriminator 30 in the lower sideband 82 (FIG. 3, Part (C)) would result in a false stabilization control signal at the output terminal 10 of the AFC system. In other words, a negative error signal would be produced when the intermediate center frequency is too high instead of the positive error signal required to make the correction. Conversely, a positive error signal would be produced when the intermediate center frequency has drifted too low instead of the negative signal required to produce the proper change in the oscillating frequency of the FM oscillator 8 (FIG. 1).

The representations made in the drawings and the description are intended merely to facilitate the practice of this invention, not to restrict its scope. Moreover, it is obvious that many circuit variations may be made with respect to the disclosed embodiment while remaining within the boundaries of this invention as established by the following claims.

We claim:

1. A circuit for acquiring and stabilizing the center frequency of a frequency-modulated signal comprising:

a first input terminal for a frequency-modulated signal;

means operable through a predetermined range of frequencies coupled to the first terminal for demodulating the frequency-modulated signal to produce a composite output signal including a reproduction of the original modulating signal as a first component, and a unidirectional potential representing the direction and magnitude of deviations, if any, of the actual center frequency of the frequency-modulated signal from the correct center frequency as a second component;

a second input terminal for a modulation signal;

means coupled to the second terminal and to the demodulating means for inverting the phase of the modulation signal, and including further means for adding at least a low-frequency portion of the inverted modulation signal to the first component of the composite signal to cancel at least the corresponding low-frequency portion of the latter;

an integrating amplifier coupled to the demodulating means for amplifying and at least partially-integrating the second component of the composite signal, and eliminating effectively any uncancelled high-frequency portions of the first component of the composite signal to provide a unidirectional center-frequency error signal having a polarity and magnitude suitable for use in restoring the frequency-modulated signal to the correct center frequency;

and means coupled effectively to the first input terminal and to the integrating amplifier, and including a bandpass filter having a frequency bandpass characteristic with effective upper and lower frequency limits within the range of operating frequencies of the demodulating means and coupled effectively to the first input terminal, for generating an acquisition pulse useful in sweeping the actual center frequency into the predetermined range of operating frequencies of the demodulating means whenever a deviation of the actual center frequency exceeds predetermined limits within the frequency-bandpass characteristic of the bandpass filter.

2. A circuit for acquiring and stabilizing the center frequency of a frequency-modulated signal comprising:

a first input terminal for a frequency-modulated signal;

means operable through a predetermined range of frequencies coupled to the first terminal for demodulating the frequency-modulated signal to produce a composite output signal including a reproduction of the original modulating signal as a first component, and a unidirectional potential representing the direction and magnitude of deviations, if any, of the actual center frequency of the frequency-modulated signal from the correct center frequency as a second component;

a second input terminal for a modulation signal;

means coupled to the second terminal and to the demodulation means for inverting the phase of the modulation signal, and including further means for adding at least a low-frequency portion of the inverted modulation signal to the first component of the composite signal to cancel at least the corresponding low-frequency portion of the latter so that the second component will remain as a unidirectional center-frequency error signal;

and means coupled to the demodulating means and to the adding means for generating a center-frequency acquisition pulse whenever the deviation of the actual center frequency exceeds the operating frequency limits of the demodulating means.

3. A circuit for acquiring and stabilizing the center frequency of a frequency-modulated signal comprising:

a first input terminal for a frequency-modulated signal;

means operable through a predetermined range of frequencies coupled to the first terminal for demodulating the frequency-modulated signal to produce a composite output signal including a reproduction of the original modulating signal as a first component, and a unidirectional potential representing the direction and magnitude of deviations, if any, of the actual center frequency of the frequency-modulated signal from the correct center frequency as a second component;

a second input terminal for a modulation signal;

means coupled to the second terminal and to the demodulation means for inverting the phase of the modulation signal, and including further means for adding at least a low-frequency portion of the inverted modulation signal to the first component of the composite signal to cancel at least the corresponding low-frequency portion of the latter;

an integrator coupled to the demodulating means for eliminating effectively any uncancelled high-frequency component portions of the first component to provide a unidirectional, rate-of-change of center-frequency error signal having a polarity and magnitude suitable for use in restoring the frequency-modulated signal to the correct center frequency;

and means coupled to the integrator and effectively to the first input terminal for generating an acquisition pulse useful in sweeping the actual center frequency into the predetermined range of operating frequencies of the demodulating means, so that the error-signal may stabilize the frequency-modulated signal at the correct center frequency.

4. A circuit for acquiring and stabilizing the center frequency of a frequency-modulated signal comprising:

a first input terminal for a frequency-modulated signal;

means operable through a predetermined range of frequencies coupled to the first terminal for demodulating the frequency-modulated signal to produce a composite output signal including a reproduction of the original modulating signal as a first component, and a unidirectional potential representing the direction and magnitude of deviations, if any, of the actual center frequency of the frequency-modulated signal from the correct center frequency as a second component;

a second input terminal for a modulation signal;

means coupled to the second terminal and to the demodulation means for inverting the phase of the modulation signal, and including further means for adding at least a low-frequency portion of the inverted modulation signal to the first component of the composite signal to cancel at least the corresponding low-frequency portion of the latter;

an integrating amplifier coupled to the demodulating means for amplifying and at least partially integrating the second component of the composite signal, and eliminating effectively any uncancelled high-frequency portions of the first component of the composite signal to provide a unidirectional rate-of-change of center-frequency error signal having a polarity and magnitude suitable for use in restoring the frequency-modulated signal to the correct center frequency;

and means coupled effectively to the first input terminal and to the integrating amplifier, and including a bandpass filter having a frequency bandpass characteristic with effective upper and lower frequency limits within the range of operating frequencies of the demodulating means and coupled effectively to the first input terminal, for generating an acquisition pulse useful in sweeping the actual center frequency into the predetermined range of operating frequencies of the demodulating means whenever a deviation of the actual center frequency exceeds predetermined limits within the frequency-bandpass characteristic of the bandpass filter.

5. A linear, balanced, frequency discriminator, including:

an input terminal for a frequency modulated signal;

a discriminator output terminal;

first and second power-input terminals;

a first signal-translating channel including a first transistor having an input element coupled directly to the input terminal, an output element, and a third element, a resistor coupled between the third element and the first power-input terminal to provide a unidirectional bias potential for the third element and a degenerative feedback signal to limit gain at the output element to about unity, a first parallel-resonant circuit tuned for peak signal response at a frequency above the center frequency of the frequency-modulated signal and formed by a first inductor coupled between the output element and the second power-input terminal and a first capacitor coupled between the output element and the first power-input terminal, a unidirectionally-conductive device coupled to the output element and oriented to conduct during first half cycles of the frequency-modulated signal, and an integrator-network coupled between the device and the output terminal;

and a second signal-translating channel including a second transistor having an input element coupled directly to the input terminal, an output element, and a third element, a resistor coupled between the third element and the first power-input terminal to provide a unidirectional bias potential for the third element and a degenerative feedback signal to limit gain developed at the output element to about unity, a second parallel-resonant circuit having a Q equal to the first parallel-resonant circuit and tuned for peak signal response at a frequency as far below as the peak-response frequency of the first circuit is above the correct center frequency and formed by a second inductor coupled between the output element and the second power-input terminal and a second capacitor coupled between the output element and the first power-input terminal, a unidirectionally-conductive device coupled to the output terminal and oriented to conduct during second half cycles of the frequency-modulated signal, and an integrator network coupled between the device and the output terminal.

6. In a system for generating a frequency-modulated carrier signal, and including a frequency modulator, a frequency-modulated oscillator for producing the frequency-modulated carrier, and a local oscillator for producing a stable-frequency local oscillator signal, an automatic center-frequency acquisition and stabilization unit comprising:

means coupled effectively to the frequency-modulated oscillator and to the local oscillator for mixing a portion of the frequency-modulated carrier signal with the local-oscillator signal to develop an intermediate frequency-modulated signal;

a frequency discriminator operable through a predetermined range of frequencies including the correct intermediate center frequency of the intermediate signal coupled effectively to the mixing means for producing a unidirectional signal representing the direction and magnitude of the existing deviation if any, of the actual from the correct intermediate center frequency of the intermediate signal;

means including an integrating amplifier coupled effectively between the discriminator and the frequency modulator for amplifying and eliminating modulation components from the unidirectional signal so that the latter may constitute an error signal for restoring and stabilizing the frequency-modulated signal to the correct center frequency;

means coupled effectively to the mixing means for passing at least a portion of the intermediate signal within a band of frequencies containing the correct intermediate center frequency and within the upper and lower limits of the operating range of frequencies of the discriminator, and attenuating signal components of other frequencies;

a frequency-threshold detector coupled to the passing means for producing a first unidirectional output signal in response to signal components within the frequency band, and a second unidirectional signal differing from the first signal in the absence of signal components within the ferquency band;

and a center-frequency, acquisition-pulse generator made up of a first, normally-open, monostable electronic switch having a control element coupled to the threshold detector, and an output element, a second bistable electronic switch having first and second control elements and an output element, a differentiator circuit coupled between the output element of the first switch and the first control element of the second switch to produce an electrical pulse for closing the latter in response to closure of the first switch, a network having a first time constant coupled between the output element of the second switch and a circuit point common to the discriminator and the integrating amplifier to begin generation of the leading edge of the acquisition pulse at the output of the integrating amplifier by applying a first changing unidirectional voltage to the input of the amplifier in response to closure of the second switch, a network having a second time constant longer than the first time constant coupled between the output element of the first switch and the circuit point common to the discriminator and the integrating amplifier for applying a second unidirectional voltage changing more slowly than the first voltage to the input of the amplifier in response to opening of the second switch, a feedback circuit coupled between the output of the integrating amplifier and the second control element for opening the second switch in response to a unidirectional output signal of predetermined magnitude from the amplifier in order to terminate the generation of the first unidirectional voltage and enable the second network to control the generation of a trailing edge for the acquisition pulse produced at the output of the integrating amplifier in the form of a unidirectional amplifier output signal changing in a direction opposite to and at a slower rate than the leading edge, and means coupled between the output element of the second switch and the first switch to prevent the latter from opening during the time interval that the second switch is closed.

7. An automatic, frequency-modulation signal center-frequency acquisition and control unit as represented in claim 6, wherein the first and second electronic switches each comprise a two-stage, transistor amplifier intercoupled directly in complementary symmetry.

8. In a system for generating a frequency-modulated carrier signal, and including a frequency modulator, a frequency-modulated oscillator for producing the frequency-modulated carrier, and a local oscillator for producing a stable-frequency local oscillator signal, an automatic center-frequency acquisition and stabilization unit comprising:

means coupled effectively to the frequency-modulated oscillator and to the local oscillator for mixing a portion of the frequency-modulated carrier signal with the local-oscillator signal to develop an intermediate frequency-modulated signal;

a frequency discriminator operable through a predetermined range of frequencies including the correct intermediate center frequency of the intermediate signal coupled effectively to the mixing means for producing a unidirectional signal representing the direction and magnitude of the existing deviation, if any, of the actual from the correct intermediate center frequency of the intermediate signal;

means including an integrating amplifier coupled effectively between the discriminator and the frequency modulator for amplifying and eliminating modulation components from the unidirectional signal so that the latter may constitute an error signal for restoring and stabilizing the frequency-modulated signal to the correct center frequency;

means coupled effectively to the mixing means for developing a unidirectional disabling signal in response to dominant intermediate signal frequencies within the operating range of frequencies of the discriminator, and a unidirectional triggering signal in response to the absence of dominant intermediate signal frequencies within the operating frequency range of the discriminator;

and a center-frequency, acquisition pulse generator made up of a first, normally-open monostable electronic switch having a control element coupled to the trigger-signal and disabling-signal developing means, and an output element, a second bistable electronic switch having first and second control elements and an output element, a differentiator circuit coupled between the output element of the first switch and the first control element of the second switch to produce an electrical pulse for closing the latter in response to closure of the first switch, a network having a first time constant coupled between the output element of the second switch and a circuit point common to the discriminator and the integrating amplifier to begin generation of the leading edge of the acquisition pulse at the output of the integrating amplifier by applying a first changing unidirectional voltage to the input of the amplifier in response to closure of the second switch, a network having a second time constant longer than the first time constant coupled between the output element of the first switch and the circuit point common to the discriminator and the integrating amplifier for applying a second unidirectional voltage changing more slowly than the first voltage to the input of the amplifier in response to opening of the second switch, a feedback circuit coupled between the output of the integrating amplifier and the second control element for opening the second switch in response to a unidirectional output signal of predetermined magnitude from the amplifier in order to terminate the generation of the first unidirectional voltage and enable the second network to control the generation of a trailing edge for the acquisition-pulse produced at the output of the integrating amplifier in the form of a unidirectional amplifier output signal changing in a direction opposite to and at a slower rate than the leading edge, and means coupled between the output element of the second switch and the first switch to prevent the latter from opening during the time interval that the second switch is closed.

9. For use in a frequency-modulating system for generating a frequency-modulated carrier signal having a correct center frequency on the order of several thousand megacycles to bring the actual center frequency of the carrier signal within the comparatively narrow range of operating frequencies of a center-frequency stabilizing circuit including means for mixing the carrier signal with a reference-frequency signal to produce an intermediate frequency-modulation signal, a balanced discriminator and an integrating amplifier coupled in series in the order named, an acquisition signal generator comprising in combination:

means coupled effectively to the mixing means for developing a unidirectional disabling signal in response to dominant intermediate signal frequencies within the operating range of frequencies of the discriminator, and a unidirectional triggering signal in response to the absence of dominant intermediate signal frequencies within the operating frequency range of the discriminator;

and a center-frequency, acquisition pulse generator made up of a first, normally-open, monostable electronic switch having a control element coupled to the trigger-signal and disabling-signal developing means and an output element, a second bistable electronic switch having first and second control elements and an output element, a differentiator circuit coupled between the output element of the first switch and the first control element of the second switch to produce an electrical pulse for closing the latter in response to closure of the first switch, a network having a first time constant coupled between the output element of the second switch and a circuit point common to the discriminator and the integrating amplifier to begin generation of the leading edge of the acquisition pulse at the output of the integrating amplifier by applying a first changing unidirectional voltage to the input of the amplifier in response to closure of the second switch, a network having a second time constant longer than the first time constant coupled between the output element of the first switch and the circuit point common to the discriminator and the integrating amplifier applying a second unidirectional voltage changing more slowly than the first voltage to the input of the amplifier in response to opening of the second switch, a feedback circuit coupled between the output of the integrating amplifier and the second control element for opening the second switch in response to a unidirectional output signal of predetermined magnitude from the amplifier in order to terminate the generation of the first unidirectional voltage and enable the second network to control the generation of a trailing edge for the acquisition-pulse produced at the output of the integrating amplifier in the form of a unidirectional amplifier output signal changing in a direction opposite to and at a slower rate than the leading edge, and means coupled between the output element of the second switch and the first switch to prevent the latter from opening during the time interval that the second switch is closed.

10. In a system for generating a frequency-modulated carrier signal, and including a frequency modulator, a frequency-modulated oscillator for producing the frequency-modulated carrier, and a local oscillator for producing a stable-frequency local oscillator signal, an automatic center-frequency acquisition and stabilization unit comprising:

means coupled effectively to the frequency-modulated oscillator and to the local oscillator for mixing a portion of the frequency-modulated carrier signal with the local-oscillator signal to develop an intermediate frequency-modulated signal;

a balanced frequency discriminator operable only through a predetermined range of frequencies including the correct intermediate center frequency of the intermediate signal, and having a first signal-translating channel tuned for maximum signal response at a first intermediate frequency above the correct intermediate center frequency, a second signal-translating channel tuned for maximum signal response at a second intermediate frequency below the correct intermediate center frequency, means coupled to the first and second channels and including a common discriminator output terminal for adding algebraically the respective output signals of the channels to produce a unidirectional signal, a first transistor having a signal-input element coupled effectively and directly to the mixing means, and a signal-output conductor coupled to the first channel, and a second transistor having a signal-input element coupled to the input conductor of the first transistor, and a signal-output conductor coupled to the second channel;

means including an integrating amplifier coupled effectively between the discriminator and the frequency modulator for amplifying and eliminating modulation components from the unidirectional signal so that the latter may constitute an error signal for restoring and stabilizing the frequency-modulated signal to the correct center frequency;

means coupled effectively to the mixing means for passing at least a portion of the intermediate signal within a band of frequencies containing the correct intermediate center frequency and within the upper and lower limits of the operating range of frequencies of the discriminator, and attenuating signal components of other frequencies;

a frequency-threshold detector coupled to the passing means for producing a first unidirectional output signal in response to signal components within the frequency band, and a second unidirectional signal differing from the first signal in the absence of signal components within the frequency band;

and a center-frequency, acquisition-pulse generator made up of a first, normally-open, monostable electronic switch having a control element coupled to the threshold detector, and an output element, a second bistable electronic switch having first and second control elements and an output element, a differentiator circuit coupled between the output element of the first switch and the first control element of the second switch to produce an electrical pulse for closing the latter in response to closure of the first switch, a network having a first time constant coupled between the output element of the second switch and a circuit point common to the discriminator and the integrating amplifier to begin generation of the leading edge of the acquisition pulse at the output of the integrating amplifier by applying a first, changing unidirectional voltage to the input of the amplifier in response to closure of the second switch, a network having a second time constant longer than the first time constant coupled between the output element of the first switch and the circuit point common to the discriminator and the integrating amplifier for applying a second unidirectional voltage changing more slowly than the first voltage to the input of the amplifier in response to opening of the second switch, a feedback circuit coupled between the output of the integrating amplifier and the second control element for opening the second switch in response to a unidirectional output signal of predetermined magnitude from the amplifier in order to terminate the generation of the first unidirectional voltage and enable the second network to control the generation of a trailing edge for the acquisition pulse produced at the output of the integrating amplifier in the form of a unidirectional amplifier output signal changing in a direction opposite to and at a slower rate than the leading edge, and means coupled between the output element of the second switch and the first switch to prevent the latter from opening during the time interval that the second switch is closed.

11. A circuit for acquiring and stabilizing the center frequency of a frequency-modulated signal, including:

a first input terminal for the frequency-modulated signal;

means including a balanced discriminator having substantially identical operating characteristics on both sides of a correct center frequency and operable through a particular range of frequencies for demodulating the frequency-modulated signal to produce an error signal having a magnitude representing the magnitude of the deviation of the actual center frequency of the frequency-modulated signal from the correct center frequency and having a polarity representing the direction of the deviation of the actual center frequency of the signal from the correct center frequency;

means coupled effectively to the input terminal and to the error-signal producing means for generating a center frequency acquisition pulse having rising and falling characteristics whenever the magnitude of the pulse from the demodulating means exceeds a particular value to indicate that the deviation of the actual center frequency exceeds the particular range of frequencies of the demodulating means; and means operatively coupled to the last mentioned means for using only a particular portion of the rising and falling characteristics of the acquisition pulse to return the frequency-modulated signal to the correct center frequency.

12. In a system for generating a frequency-modulated carrier signal, and including a frequency modulator, a frequency-modulated oscillator for producing the frequency-modulated carrier signal, and a local oscillator for producing a stable-frequency local-oscillator signal:

first means coupled effectively to the frequency-modulated oscillator and to the local oscillator for mixing the frequency-modulated carrier signal with the local-oscillator signal to develop a pair of intermediate frequency-modulated signals having an actual center frequency;

a frequency discriminator balanced to provide substantially identical characteristics on both sides of a correct center frequency and operable through a particular range of frequencies including the correct center frequency of the intermediate frequency-modulated signals and coupled to the first means for producing a unidirectional signal having a magnitude representing the magnitude of any existing deviation of the actual center frequency from the correct center frequency of the intermediate frequency-modulated signals and having a polarity representing the direction of any such deviation and having modulation components at the frequency of the intermediate frequency-modulated signals;

second means coupled to the frequency discriminator for eliminating the modulation components from the unidirectional signal so that the latter may constitute an error signal for restoring and stabilizing the intermediate frequency-modulated signals to the correct center frequency;

third means coupled to the second means for generating a center frequency acquisition pulse having a rising portion and a falling portion whenever the deviation of the actual intermediate center frequency exceeds the particular frequency range of the frequency discriminator;

fourth means coupled to the second means and to the frequency-modulated oscillator for varying the center frequency of the frequency-modulated carrier signal in accordance with the amplitude of the unidirectional signal at successive instants of time;

fifth means responsive to the acquisition pulse and operatively coupled to the second means for obtaining variations in the center frequency of the frequency-modulated carrier signal in accordance with the characteristics of the acquisition pulse at successive instants of time; and sixth means operatively coupled to the third means for preventing the acquisition pulse from being produced during the time that the frequency-modulated local oscillator would be responding to a particular one of the pair of intermediate frequency-modulated signals.

13. In a system for generating a frequency-modulated carrier signal, and including a frequency modulator, a frequency-modulated oscillator for producing the frequency-modulated carrier signal, and a local oscillator for producing a stable-frequency local oscillator signal:

first means coupled to the frequency-modulated oscillator and to the local oscillator for mixing the frequency-modulated carrier signal with the local-oscillator signal to develop a pair of intermediate frequency-modulated signals having an actual center frequency;

a frequency discriminator having a balanced operation on both sides of a correct center frequency to provide substantially identical characteristics on both sides of the correct center frequency and operable through a particular range of frequencies including the correct center frequency of the intermediate frequency-modulated signals and coupled to the first means for producing a unidirectional signal having a magnitude representing the magnitude of any existing deviation of the actual center frequency from the correct center frequency of the intermediate frequency-modulated signals and having a polarity representing the direction of such deviation;

second means coupled to the frequency discriminator for generating a center frequency acquisition pulse whenever the deviation of the actual center frequency exceeds the particular range of frequencies of the frequency discriminator;

third means responsive to the unidirectional signal for adjusting the frequency of the frequency modulated carrier signal to obtain the correct center frequency of the intermediate frequency-modulated signal; and fourth means operatively coupled to the first means and to the second means for preventing the second means from producing the acquisition pulse during the time that the frequency-modulated oscillator would be responding to a particular one of the pair of intermediate frequency-modulated signals.

14. In a system for generating a frequency-modulated carrier signal, and including a frequency modulator, a frequency-modulated oscillator for producing the frequency-modulated carrier signal, and a local oscillator for producing a stable-frequency local oscillator signal:

first means coupled to the frequency-modulated oscillator and to the local oscillator for mixing the frequency-modulated carrier signal with the local-oscillator signal to develop a pair of intermediate frequency-modulated signals;

a balanced frequency discriminator operable only through a particular range of frequencies including a correct intermediate center frequency of the intermediate frequency-modulated signals and having a first signal-translating channel tuned for maximum signal response at a first intermediate frequency above the correct intermediate center frequency to provide a first signal, a second signal-translating channel tuned for maximum signal response at a second intermediate frequency below the correct intermediate center frequency and having response characteristics below the correct intermediate center frequency corresponding to those of the first signal-translating channel above the correct intermediate center frequency to provide a second signal, and means coupled to the first and second channels and including a common discriminator output terminal for adding algebraically the first and second signals from the first and second channels;

second means coupled to the discriminator output terminal for filtering the unidirectional signal so that the latter may constitute an error signal for restoring and stabilizing the intermediate frequency-modulated signals to the correct center frequency;

third means coupled to the second means for generating a center-frequency acquisition pulse whenever the deviation of the actual intermediate center frequency of the intermediate frequency-modulated signals exceeds the particular range of frequencies and for introducing the acquisition pulse to the second means to vary the characteristics of the unidirectional signal;

means coupled to the second means and to the frequency-modulated oscillator for varying the frequency of the frequency-modulated carrier signal in accordance with the characteristics of the unidirectional signal from the second means; and means coupled to the second means and to the first means for preventing the second means from producing the acquisition pulse during the time that the frequency-modulated oscillator would be responding to a particular one of the pair of frequency-modulated signals.

15. In a system for generating a frequency-modulated carrier signal, and including a frequency modulator, a frequency-modulated oscillator for producing the frequency-modulated carrier signal, and a local oscillator for producing a stable-frequency oscillator signal:

first means coupled to the frequency-modulated oscillator and to the local oscillator for mixing the frequency-modulated carrier signal with the local-oscillator signal to develop a pair of intermediate frequency-modulated signals;

a balanced frequency discriminator operable only through a particular range of frequencies including a correct intermediate center frequency of the intermediate frequency-modulated signals and having properties of providing substantially identical operating characteristics on both sides of the correct intermediate center frequency and having a first signal-translating channel tuned for maximum signal response at a first intermediate frequency above the correct intermediate center frequency to provide a first signal, a second signal-translating channel tuned for maximum signal response at a second intermediate frequency below the correct intermediate center frequency and having substantially identical response characteristics at frequencies above the correct intermediate center frequency as the response characteristics of the first signal-translating channel below the correct intermediate center frequency to provide a second signal, means coupled to the first and second channels and including a common discriminator output terminal for adding algebraically the first and second signals from the first and second channels to provide a unidirectional signal;

second means coupled to the discriminator output terminal for filtering the unidirectional signal so that the unidirectional signal may constitute an error signal for restoring and stabilizing the frequency-modulated signals to the correct intermediate center frequency;

third means coupled to the second means for generating a center-frequency acquisition pulse whenever the deviation of the actual intermediate center frequency exceeds the particular range of frequencies of the discriminator;

fourth means coupled to the third means for adjusting the frequency of the frequency-modulated carrier signal in accordance with the characteristics of the acquisition pulse at each instant; and fifth means operatively coupled to the third means and to the second means for preventing the second means from responding to the acquisition pulse during the time that the frequency-modulated oscillator would be responding to a particular one of the pair of intermediate frequency-modulated signals.

16. In a system for generating a frequency-modulated carrier signal, and including a frequency modulator, a frequency-modulated oscillator for producing the frequency-modulated carrier signal, and a local oscillator for producing a stable-frequency local oscillator signal:

first means coupled to the frequency-modulated oscillator and to the local oscillator for mixing the frequency-modulated carrier signal with the local-oscillator signal to develop a pair of intermediate frequency-modulated signals;

a frequency discriminator operable through a particular range of frequencies including a correct intermediate center frequency of the intermediate frequency-modulated signals and provided with balanced characteristics to obtain substantially the same operating characteristics on one side of the correct intermediate center frequency as on the other side and coupled to the first means for producing a unidirectional signal having a magnitude representing the magnitude of any existing deviation of the actual intermediate center frequency from the correct intermediate center frequency of the intermediate frequency-modulated signals and having a polarity representing the direction of any such deviation and having modulation components at the frequency of the intermediate frequency-modulated signals;

second means including an integrating amplifier coupled to the frequency discriminator for amplifying the unidirectional signal from eliminating the modulation components from the unidirectional signal so that the unidirectional signal may constitute an error signal for restoring and stabilizing the intermediate frequency-modulated signals to the correct intermediate center frequency;

third means coupled effectively to the second means for generating a center-frequency acquisition pulse whenever the deviation of the actual intermediate center frequency exceeds the particular range of frequencies of the frequency discriminator and for introducing the pulse to the integrating amplifier to vary the characteristics of the unidirectional signal in accordance with the characteristics of the pulse;

fourth means coupled to the integrating amplifier and to the frequency-modulated oscillator for varying the frequency of the frequency-modulated carrier signal in accordance with the characteristics of the integrating signal from the integrating amplifier; and fifth means coupled to the third means and to the fourth means for preventing the acquisition pulse from being produced during the time that the frequency-modulated oscillator would be responding to a particular one of the pair of intermediate frequency-modulated signals.

17. In a system for generating a frequency-modulated carrier signal, and including a frequency modulator, a frequency-modulated oscillator for producing the frequency-modulated carrier signal, and a local oscillator for producing a stable-frequency local oscillator signal:

first means coupled to the frequency-modulated oscillator and to the local oscillator for mixing the frequency-modulated carrier signal with the local-oscillator signal to develop a pair of intermediate frequency-modulated signals;

a frequency discriminator operable through a particular range of frequencies including a correct intermediate center frequency of the intermediate frequency-modulated signals and coupled to the first means for producing a unidirectional signal having a magnitude representing the magnitude of any existing deviation of the center frequency from the correct intermediate center frequency of the intermediate frequency-modulated signals and having a polarity representing the direction of any such deviation and having modulation components at the frequencies of the intermediate frequency-modulated signals;

second means including an integrating amplifier coupled to the discriminator for amplifying the unidirectional signals and eliminating the modulation components from the unidirectional signal so that the unidirectional signal may constitute an error signal for restoring and stabilizing the intermediate frequency-modulated signals to the correct center frequency;

third means coupled to the second means for generating a center-frequency acquisition pulse whenever the deviation of the actual intermediate center frequency exceeds the particular range of frequencies of the discriminator and for introducing the acquisition pulse to the second means to vary the characteristics of the unidirectional signal in accordance with the characteristics of the acquisition pulse;

fourth means coupled to the third means and to the frequency-modulated oscillator for varying the frequency of the frequency-modulated carrier signal in accordance with the characteristics of the unidirectional signal; and fifth means coupled to the first and third means for preventing the acquisition pulse from being produced during the time that the frequency-modulated oscillator would be responding to a particular one of the pair of intermediate frequency-modulated signals.

18. In a system for generating a frequency-modulated carrier signal, and including a frequency modulator, a frequency-modulated oscillator for producing the frequency-modulated carrier signal, and a local oscillator for producing a stable-frequency local oscillator signal:

first means coupled to the frequency-modulated oscillator and to the local oscillator for mixing the frequency-modulated carrier signal with the local-oscillator signal to develop a pair of intermediate frequency-modulated signals;

frequency discriminator means operable through a particular range of frequencies including a correct intermediate center frequency of the intermediate frequency-modulated signals and coupled to the first means for producing a unidirectional signal having a magnitude representing the magnitude of any existing deviation of the actual intermediate center frequency from the correct intermediate center frequency of the intermediate frequency-modulated signals and having a polarity representing the direction of any such deviation;

second means coupled to the frequency discriminator means for generating a center-frequency acquisition pulse whenever the deviation of the actual intermediate center frequency exceeds the particular range of frequencies of the discriminator and for introducing the acquisition pulse to the frequency discriminator means to vary the characteristics of the unidirectional signal in accordance with the characteristics of the acquisition pulse;

fourth means coupled to the second means and to the frequency-modulated oscillator for varying the frequency of the frequency-modulated carrier signal in accordance with the characteristics of the unidirectional signal; and fifth means coupled to the first means and to the second means for obtaining the production of the acquisition pulse only in response to a particular one of the pair of intermediate frequency-modulated signals.

19. In a system for generating a frequency-modulated carrier signal, and including a frequency modulator, a frequency-modulated oscillator for producing the frequency-modulated carrier signal, and a local oscillator for producing a stable-frequency local oscillator signal:

first means coupled to the frequency-modulated oscillator and to the local oscillator for mixing the frequency-modulated carrier signal with the local-oscillator signal to develop a pair of intermediate frequency-modulated signals;

a frequency discriminator operable through a particular range of frequencies including a correct intermediate center frequency of the intermediate frequency-modulated signals and coupled to the first means for producing a unidirectional signal having a magnitude representing the magnitude of any existing deviation of the actual intermediate center frequency from the correct intermediate center frequency of the intermediate frequency-modulated signals and having a polarity representing the direction of any such deviations and having modulation components at a frequency corresponding to that of the intermediate frequency-modulated signals;

second means including an intergrating circuit coupled to the frequency discriminator for eliminating the modulation components from the unidirectional signal so that the unidirectional signal may constitute an error signal for restoring and stabilizing the intermediate frequency-modulated signals to the correct intermediate center frequency;

frequency-detector threshold means coupled to the first means and responsive only to a particular one of the pair of the intermediate frequency-modulated signals for producing a control signal upon the production of frequencies for the particular intermediate frequency-modulated signal outside of the particular range of frequencies;

a center frequency acquisition-pulse generator coupled to the second means and the threshold frequency-detector means for generating a center frequency acquisition pulse whenever the control signal is produced by the threshold detector;

third means coupled to the acquisition-pulse generator and to the second means for adjusting the characteristics of the unidirectional signal in accordance with the characteristics of the center-frequency acquisition pulse; and fourth means coupled to the second means and to the frequency-modulated oscillator for varying the frequency of the frequency-modulated carrier signal in accordance with the characteristics of the unidirectional signal.

20. In a system for generating a frequency-modulated carrier signal, and including a frequency modulator, a frequency-modulated oscillator for producing the frequency-modulated carrier signal, and a local oscillator for producing a stable-frequency local oscillator signal:

first means coupled to the frequency-modulated oscillator and to the local oscillator for mixing the frequency-modulated carrier signal with the local-oscillator signal to develop a pair of intermediate frequency modulated signals;

a frequency discriminator operable through a particular range of frequencies including a correct intermediate center frequency of the intermediate frequency modulated signals and coupled to the first means for producing a unidirectional signal having characteristics representing the direction and magnitude of any existing deviation of the actual intermediate center frequency from the correct intermediate center frequency of the intermediate frequency-modulated signals;

second means including a threshold detector coupled to the second means and responsive only to a particular one of the pair of the intermediate frequency-modulated signals for producing a control signal in response to frequencies outside of the particular range of the intermediate frequency-modulated signals;

a center frequency acquisition-pulse generator coupled to the second means and to the intergrating circuit for generating a center frequency acquisition pulse whenever the control signal is produced by the second means;

third means coupled to the second means and the frequency discriminator for varying the characteristics of the unidirectional signal in accordance with the characteristics of the acquisition pulse; and fourth means coupled to the second means and the frequency-modulated oscillator for varying the frequency of the frequency-modulated carrier signal in accordance with the characteristics of the unidirectional signal from the second means.

References Cited in the file of this patent

UNITED STATES PATENTS

| | | |
|---|---|---|
| 2,681,414 | Strandberg | June 15, 1954 |
| 2,969,458 | Parkinson | Jan. 24, 1961 |

OTHER REFERENCES

Stephenson article, Proc. I.R.E., vol. 38, No. 11, November 1950, pp. 1314–1317.

Hoge et al.: Article, Electronics, No. 1, 1957, pp. 178–179.